United States Patent
Tsumura

(10) Patent No.: US 12,055,579 B2
(45) Date of Patent: Aug. 6, 2024

(54) INSPECTION JIG AND CIRCUIT BOARD INSPECTION APPARATUS INCLUDING THE SAME

(71) Applicant: NIDEC READ CORPORATION, Kyoto (JP)

(72) Inventor: Kohei Tsumura, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 144 days.

(21) Appl. No.: 17/910,363

(22) PCT Filed: Feb. 22, 2021

(86) PCT No.: PCT/JP2021/006521
§ 371 (c)(1),
(2) Date: Sep. 9, 2022

(87) PCT Pub. No.: WO2021/182084
PCT Pub. Date: Sep. 16, 2021

(65) Prior Publication Data
US 2023/0127957 A1 Apr. 27, 2023

(30) Foreign Application Priority Data
Mar. 13, 2020 (JP) .................................. 2020-044782

(51) Int. Cl.
*G01R 31/28* (2006.01)
*G01R 1/073* (2006.01)

(52) U.S. Cl.
CPC ..... *G01R 31/2808* (2013.01); *G01R 1/07328* (2013.01)

(58) Field of Classification Search
CPC ............ G01R 31/2808; G01R 1/07328; G01R 31/2831; G01R 31/311; G01R 31/303;
(Continued)

(56) References Cited

U.S. PATENT DOCUMENTS

2002/0086562 A1* 7/2002 Uratsuji ............... G01R 1/0483
439/71
2006/0238188 A1* 10/2006 Naitou ............... G01R 31/2875
324/750.05
(Continued)

FOREIGN PATENT DOCUMENTS

JP 547869 A 2/1993
JP 5198662 A 8/1993
(Continued)

OTHER PUBLICATIONS

International Search Report issued for the corresponding PCT patent application No. PCT/JP2021/006521 dated Apr. 28, 2021, 3 pages (For informational purposes only).

*Primary Examiner* — Alvaro E Fortich
(74) *Attorney, Agent, or Firm* — Viering, Jentschura & Partner mbB; Robert M Bilotta, Jr.

(57) ABSTRACT

A circuit board inspection apparatus includes an inspection processing portion that inspects an electric circuit of a board to be inspected, an inspection jig, and a position detector used to position the inspection processing portion relative to the board to be inspected. The inspection jig includes a probe unit having a probe, a first board, a second board located in parallel with the first board in a thickness direction of the first board, an electrical connection portion that electrically connects the first board and the second board, and a second board holding portion that holds the second board from the first board and holds the probe unit on a side opposite to the first board side. The second board holding portion has a position detection opening penetrating in the thickness direction, at a position overlapping the position detector as viewed from the thickness direction of the second board holding portion.

19 Claims, 8 Drawing Sheets

(58) Field of Classification Search
CPC ............... G01R 31/2891; G01R 1/073; G01R 31/2865; G01R 31/2887; G01R 31/2889
See application file for complete search history.

(56) References Cited

U.S. PATENT DOCUMENTS

| | | | |
|---|---|---|---|
| 2009/0237099 A1* | 9/2009 | Garabedian | G01R 3/00 |
| | | | 216/13 |
| 2010/0237887 A1 | 9/2010 | Desta et al. | |
| 2019/0271721 A1* | 9/2019 | Kim | G01R 31/2886 |
| 2020/0018790 A1* | 1/2020 | Kanosue | G01R 31/2863 |

FOREIGN PATENT DOCUMENTS

| | | |
|---|---|---|
| JP | 200698146 A | 4/2006 |
| JP | 201324869 A | 2/2013 |
| JP | 2013145210 A | 7/2013 |
| JP | 201624031 A | 2/2016 |
| JP | 2016157804 A | 9/2016 |

* cited by examiner

INSPECTION JIG AND CIRCUIT BOARD INSPECTION APPARATUS INCLUDING THE SAME

CROSS-REFERENCE TO RELATED APPLICATIONS

This is a U.S. national Stage application, filed under 35 U.S.C. § 371, of International Application No. PCT/JP2021/006521, filed on Feb. 22, 2021, and claims priority under 35 U.S.C. § 119(a) and 35 U.S.C. § 365(b) from Japanese Patent Application No. 2020-044782, filed on Mar. 13, 2020, the disclosures of which are incorporated herein by reference.

FIELD

Various embodiments of the present disclosure relate to an inspection jig and a circuit board inspection apparatus including the same.

BACKGROUND

In an inspection apparatus for inspecting electrical characteristics of a wafer using a probe, an inspection apparatus including a camera for adjusting positions of the probe and the semiconductor wafer is known. Conventionally, as the inspection apparatus, a wafer test system including a probe card having a probe, a wafer chuck that holds a wafer, and a wafer alignment camera used for position adjustment of the probe and the wafer is known. The wafer alignment camera captures an image of a wafer from above and detects a position of an electrode of a chip formed on a surface of the wafer.

The wafer test system first positions the wafer under the wafer alignment camera in order to detect the position of the electrode of the chip on the wafer. Thereafter, the wafer test system inspects the wafer by moving the wafer chuck to a position where the electrode of the chip of the wafer comes in contact with the probe. When the inspection of the wafer is completed, the same operation is performed on the wafer to be inspected next.

From the viewpoint of productivity, there is a demand for minimizing the time required for inspection in the circuit board inspection apparatus. In the circuit board inspection apparatus, an inspection position of an inspection target is confirmed by a camera (position detector), and then the inspection target is positioned on a probe. In such a case, there is a problem that the inspection takes time.

SUMMARY

An exemplary inspection jig according to an embodiment of the present disclosure is an inspection jig attached to a circuit board inspection apparatus including an inspection processing portion that inspects an electric circuit of a circuit board and a position detector used when the inspection processing portion is positioned with respect to the circuit board. The inspection jig includes a probe unit having a probe that comes into contact with the circuit board, a first board on which a signal is detected by the inspection processing portion, a second board that is located in parallel with the first board in a thickness direction of the first board and is electrically connected to the probe, an electrical connection portion that electrically connects the first board and the second board, and a second board holding portion that holds the second board from the first board and holds the probe unit on a side opposite to the first board side, in a state where the electrical connection portion is sandwiched between the first board and the second board. The second board holding portion has a position detection opening penetrating the second board holding portion in the thickness direction, at a position overlapping the position detector as viewed from the thickness direction of the second board holding portion.

An exemplary circuit board inspection apparatus according to an embodiment of the present disclosure includes: an inspection processing portion configured to inspect an electric circuit of a circuit board; a position detector that is used to position the inspection processing portion with respect to the circuit board; and the inspection jig.

The above and other elements, features, steps, characteristics and advantages of the present disclosure will become more apparent from the following detailed description of the embodiments with reference to the attached drawings.

DETAILED DESCRIPTION

Figure 1:
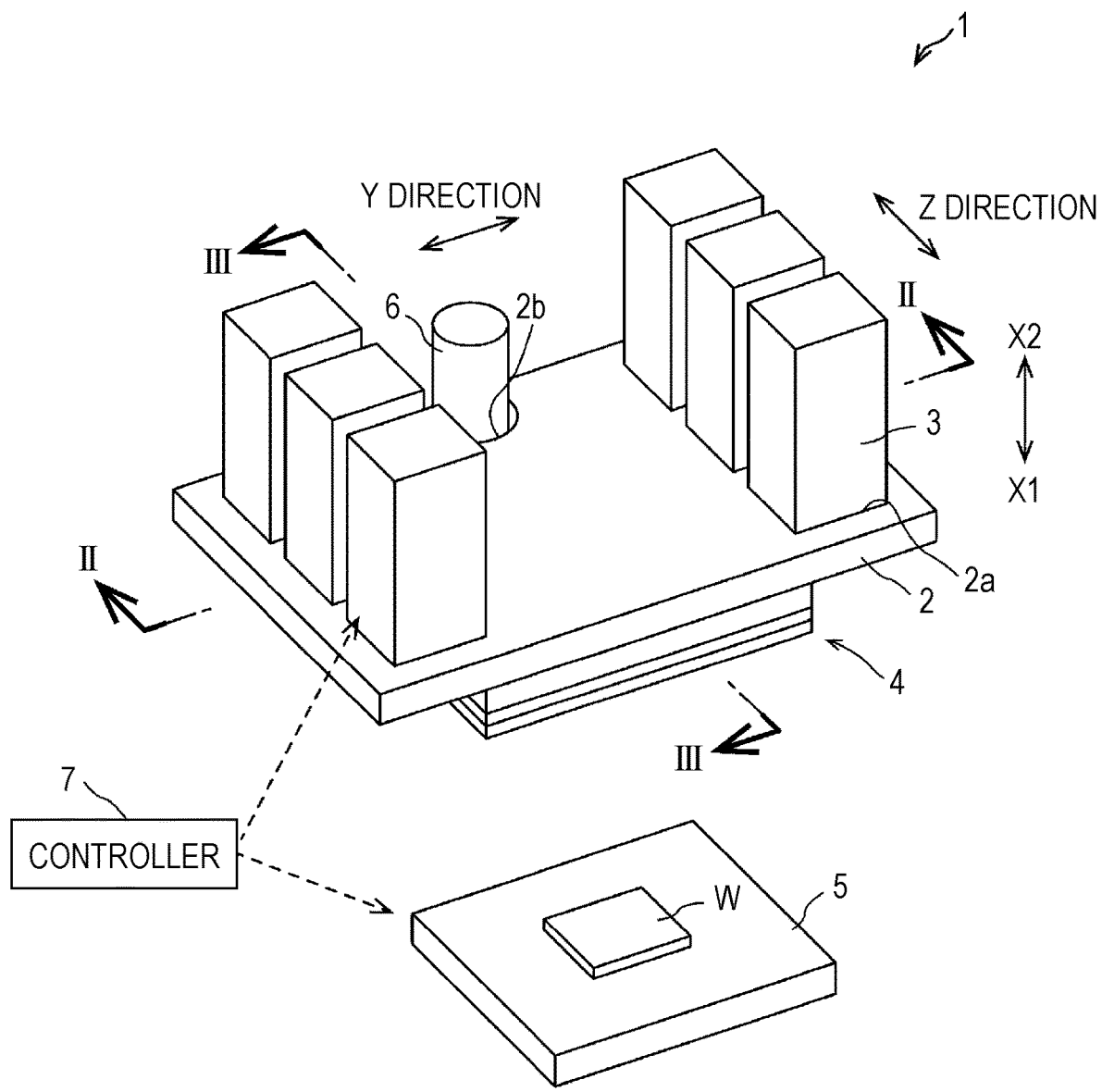
FIG. 1 is a perspective view illustrating a schematic configuration of a circuit board inspection apparatus according to an embodiment.

Embodiments of the present disclosure will be described below in detail with reference to the drawings. The same or corresponding parts in the drawings are denoted by the same reference numerals, and the description thereof will not be repeated. The constituent members in the drawings are not limited to have the dimensions and the dimensional ratios illustrated in the drawings.

In the following description, the expression "fix", "connect", "attach", or the like (hereinafter, fix or the like) is used not only when members are directly fixed or the like to each other, but also when members are fixed or the like to each other with another member interposed therebetween. That is, in the following description, the expression "fix or the like" includes the meaning of direct and indirect fixation or the like of members.

Figure 2:
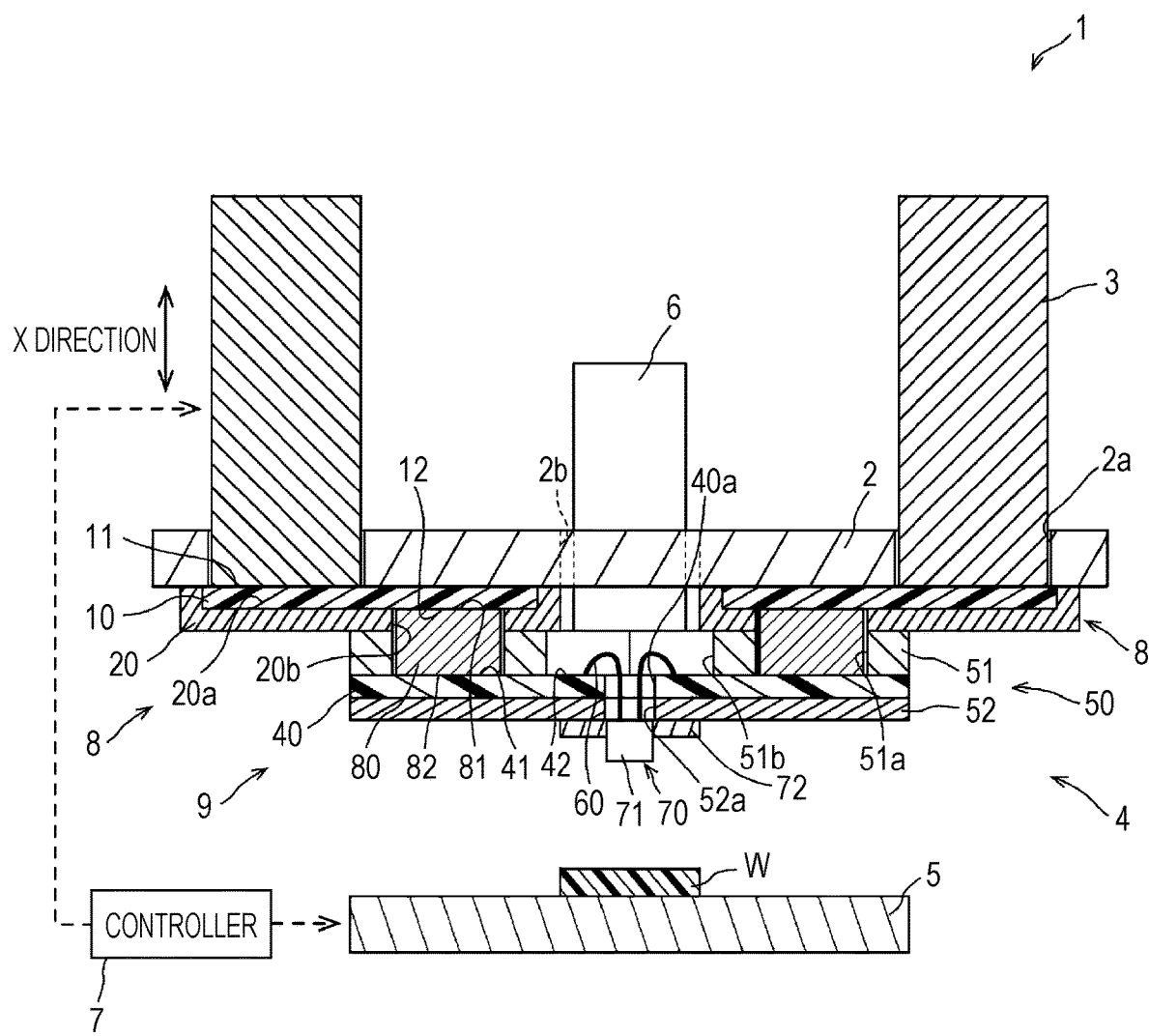
FIG. 2 is a cross-sectional view taken along line II-II of FIG. 1.
Figure 3:
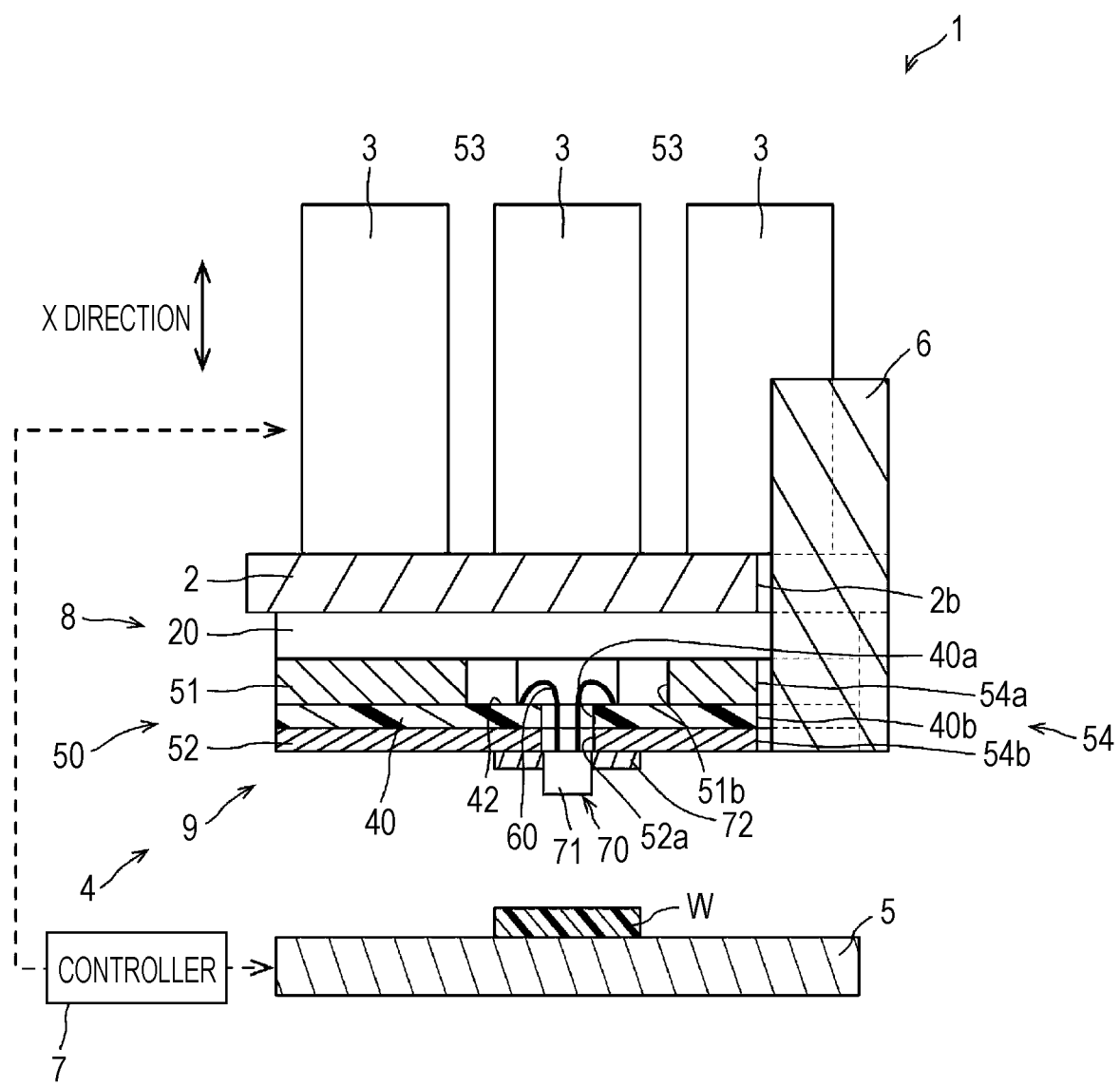
FIG. 3 is a cross-sectional view taken along line of FIG. 1.

FIG. 1 is a perspective view illustrating a schematic configuration of a circuit board inspection apparatus 1 according to an embodiment. FIGS. 2 and 3 are cross-sectional views of the circuit board inspection apparatus 1. The circuit board inspection apparatus 1 inspects an electric circuit of a board W to be inspected. The board W to be inspected is a circuit board made of resin. The circuit board inspection apparatus 1 is a circuit board inspection apparatus.

As illustrated in FIG. 1, the circuit board inspection apparatus 1 includes a flat plate 2, an inspection processing portion 3, an inspection jig 4, an inspection board mounting table 5, a position detector 6, and a controller 7. In the present embodiment, as an example, a case where the number of inspection processing portions 3 is six will be described. However, the number of inspection processing portions may be less than six or more than six.

The flat plate 2 is a member that supports the inspection processing portion 3 and the inspection jig 4. As illustrated in FIGS. 1 to 3, the flat plate 2 has a plate shape. The flat plate 2 has a rectangular opening 2a penetrating in the thickness direction. In the present embodiment, the number of openings 2a is six, which is the same as the number of the inspection processing portions 3. The six openings 2a are arranged in two rows three by three. The flat plate 2 supports the inspection processing portion 3 on one side in the thickness direction by housing a part of the inspection processing portion 3 in the opening 2a. The flat plate 2 supports the inspection jig 4 on the other side in the thickness direction.

Hereinafter, for the sake of description, the thickness direction of the flat plate 2 is referred to as an "X direction", the column direction of the opening 2a is referred to as a "Y direction", and the direction in which the three openings 2a are arranged is referred to as a "Z direction".

The flat plate 2 has a U-shaped notch 2b extending in the Z direction from one side end extending in the Y direction. The notch 2b is located at the same position as a position detection opening 54 of a second board holding portion 50 described later in the flat plate 2 as viewed from the X direction. At least a part of the position detector 6 is accommodated in the notch 2b.

The inspection processing portion 3 inputs a signal to the electric circuit of the board W to be inspected according to a command signal of the controller 7, detects an output signal of the board W to be inspected, and outputs the output signal to the controller 7. A part of each of the six inspection processing portions 3 is supported by the flat plate 2 in a state of being accommodated in each opening 2a. As a result, the inspection processing portions 3 are arranged in three rows in the Z direction and two rows in the Y direction on one side of the flat plate 2.

The inspection processing portion 3 has a terminal portion including a plurality of terminals on the end face on the side accommodated in the opening 2a. The inspection processing portion 3 is electrically connected to a first board 10 of the inspection jig 4 via the terminal portion.

The inspection jig 4 is attached to the flat plate 2 on the side opposite to the inspection processing portion 3 side. The inspection jig 4 is electrically connected to the inspection processing portion 3. In addition, the inspection jig 4 has a probe 71 on the side opposite to the inspection processing portion 3 side. The tip of the probe 71 comes into contact with a terminal of an electric circuit included in the board W to be inspected. The board W to be inspected is electrically inspected in a state where the tip of the probe 71 is in contact with the terminal of the electric circuit. Details of the inspection jig 4 will be described later.

The inspection board mounting table 5 mounts the board W to be inspected. The inspection board mounting table 5 moves in a direction approaching the inspection jig 4 and a direction separating from the inspection jig 4 in a state where the board W to be inspected is fixed on the inspection board mounting table 5. The inspection jig 4 may move with respect to the inspection board mounting table 5.

In the present embodiment, the inspection board mounting table 5 moves in the X direction, the Y direction, and the Z direction. Further, the inspection board mounting table 5 rotates by 360 degrees about the X axis. As a result, the board W to be inspected placed on the inspection board mounting table 5 is positioned at a position where the board W comes into contact with the tip of the probe 71 of the inspection jig 4. The inspection board mounting table 5 moves based on a command from the controller 7.

The position detector 6 is used to position the inspection jig 4 with respect to the board W to be inspected. The position detector 6 acquires an inspection position of the board W to be inspected while the board W to be inspected placed on the inspection board mounting table 5 is positioned at a position facing the position detector 6. The position detector 6 outputs the acquired information to the controller 7. The position detector 6 is fixed to the flat plate 2 by a fixing member (not illustrated). The position detector 6 is, for example, a camera.

The controller 7 controls the operation of the inspection processing portion 3. The controller 7 outputs a command signal to the inspection processing portion 3 to inspect the board W to be inspected. In addition, the controller 7 determines a defect or the like in the electric circuit of the board W to be inspected based on the signal received from the board W to be inspected by the inspection processing portion 3.

The controller 7 controls the operation of the inspection board mounting table 5 based on the information received from the position detector 6. Specifically, the controller 7 calculates a relative distance between the board W to be inspected and the probe 71, and outputs a command based on the calculation result to the inspection board mounting table 5. The inspection board mounting table 5 moves to a position where the terminal of the board W to be inspected placed on the inspection board mounting table 5 and the tip of the probe 71 come into contact with each other based on a command from the controller 7.

Figure 4:
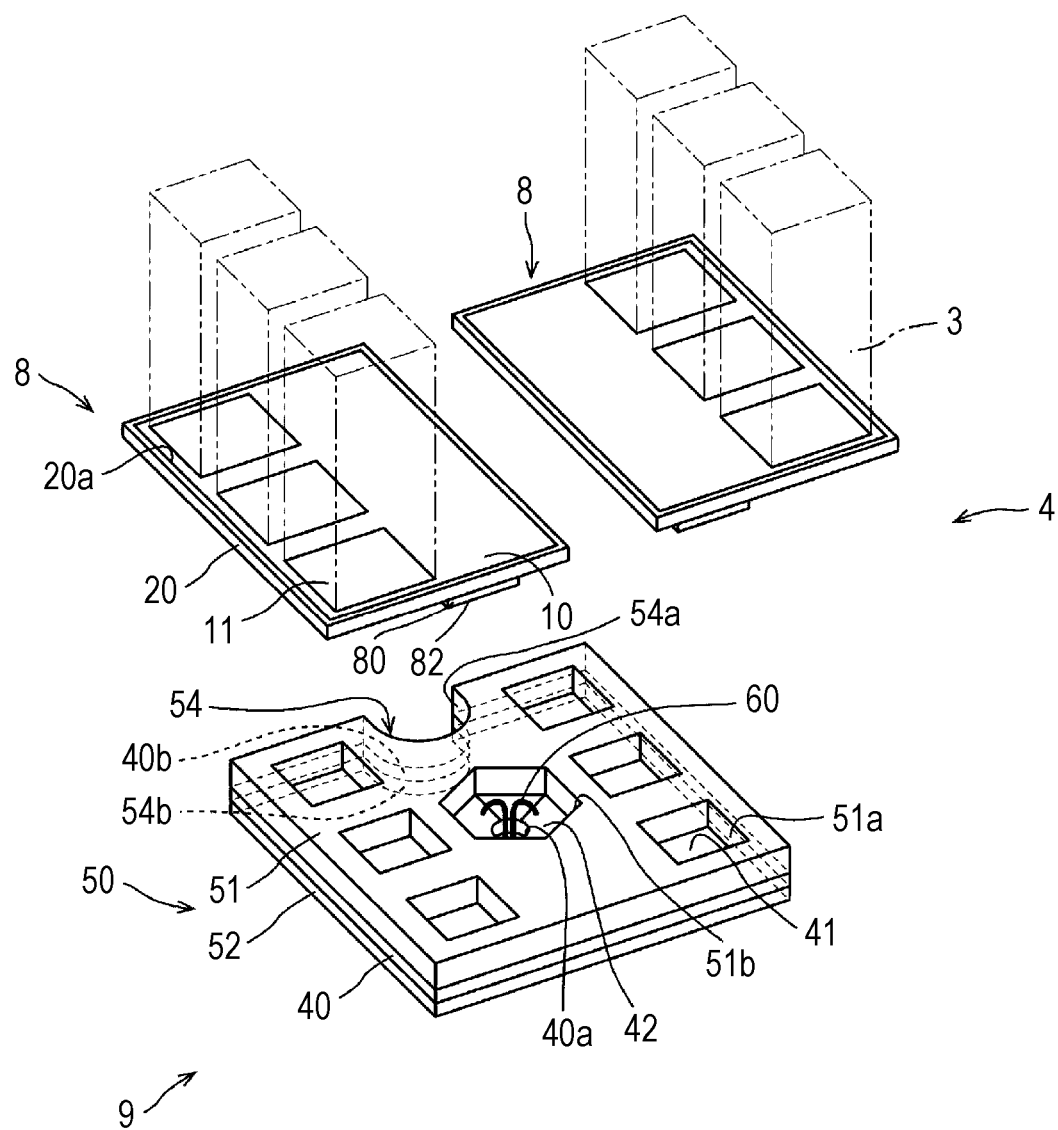
FIG. 4 is an exploded perspective view of an inspection jig.
Figure 5:
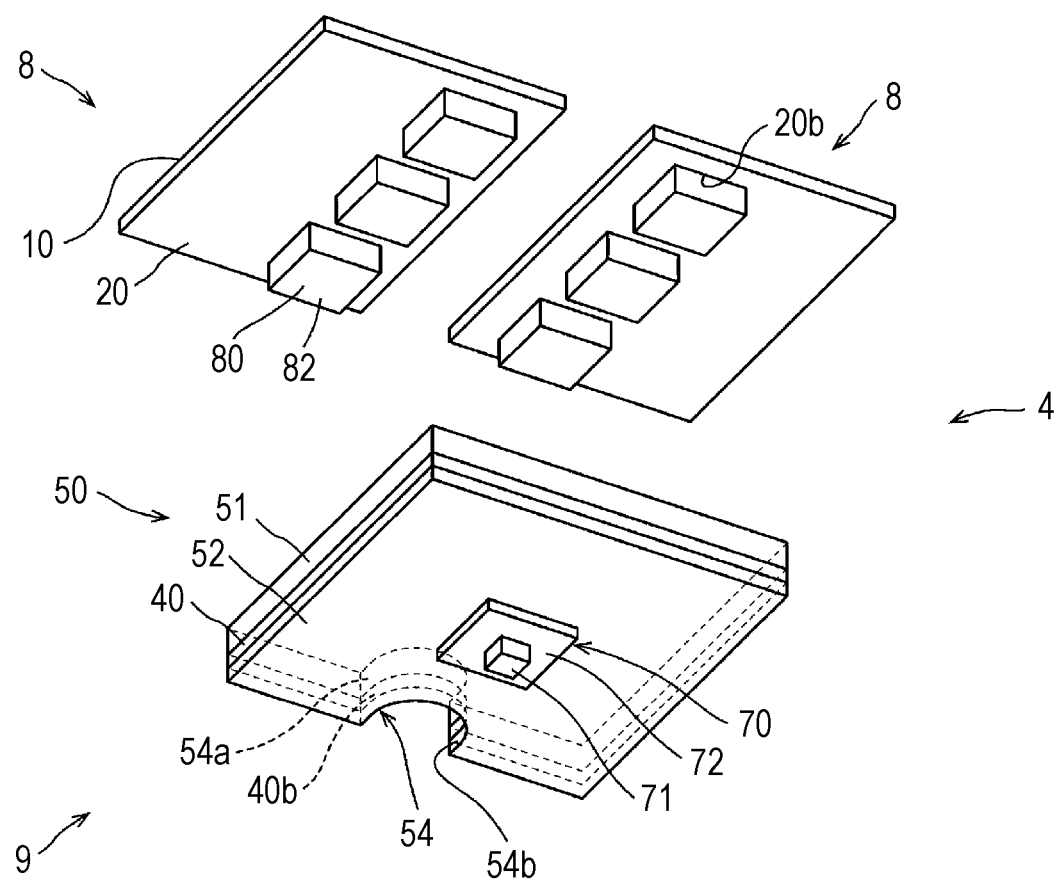
FIG. 5 is an exploded perspective view of the inspection jig.

Next, the inspection jig 4 will be described in detail with reference to FIGS. 1 to 5. The inspection jig 4 includes a first board unit 8 having a first board 10, a second board unit 9 having a second board 40, and an electrical connection portion 80 electrically connecting the first board 10 and the second board 40. The first board 10 and the second board 40 face each other, and are located in parallel, in the thickness direction, in the order of the first board 10 and the second board 40 from the side close to the flat plate 2. FIGS. 4 and 5 are perspective views illustrating the second board unit 9 separated from the inspection jig 4.

As illustrated in FIGS. 2, 4, and 5, the first board unit 8 includes the first board 10 and a first board accommodating portion 20. In the present embodiment, the inspection jig 4 includes two first board units 8. Each of the two first board units 8 is attached at a position that covers the three aligned openings 2a of the flat plate 2 and at a position that does not cover the notch 2b of the flat plate 2. That is, each of the first board units 8 faces the end face of the inspection processing portion 3 accommodated in the opening 2a. The constituent members of the two first board units 8 are located symmetrically in the Y direction about the center line of the flat plate 2 in the Y direction in a state where the first board unit 8 is attached to the flat plate 2. Since the two first board units 8 have the same configuration, the configuration of one first board unit 8 will be described below.

The first board 10 is a rectangular resin circuit board extending in the Y direction and the Z direction. An electric circuit is formed on the first board 10. As illustrated in FIG. 2, the first board 10 has a body-side terminal portion 11 constituting a terminal on one side of the electric circuit on a surface on the flat plate 2 side. In addition, the first board 10 has a second board-side terminal portion 12 constituting a terminal on the other side of the electric circuit on a surface on the second board 40 side. The first board 10 has three body-side terminal portions 11 on the surface on the flat plate 2 side and three second board-side terminal portions 12 on the surface on the second board 40 side.

The body-side terminal portion 11 is in contact with the terminal portion of each inspection processing portion 3. As a result, the signal of the electric circuit transmitted to the first board 10 is transmitted to the inspection processing portion 3. The three second board-side terminal portions 12 are electrically connected to the second board 40 via the electrical connection portion 80 described later.

The first board accommodating portion 20 has a plate shape extending in the Y direction and the Z direction. The first board accommodating portion 20 is made of a metal material having high rigidity. The metal material is, for example, a metal having aluminum. As illustrated in FIGS. 2 and 4, the first board accommodating portion 20 has a recess 20a on the flat plate 2 side. The first board 10 is accommodated in the recess 20a.

As illustrated in FIGS. 2 and 5, the first board accommodating portion 20 has three rectangular openings 20b penetrating in the thickness direction on the bottom surface of the recess 20a. The three openings 20b are located at positions corresponding to the three second board-side terminal portions 12 in the first board accommodating portion 20. That is, the second board-side terminal portion 12 is exposed from the first board accommodating portion 20 by the three openings 20b.

As described above, in the present embodiment, the inspection jig 4 includes the two first board units 8. Therefore, the inspection jig 4 includes six body-side terminal portions 11, six second board-side terminal portions 12, and six openings 20b. That is, the openings 20b are arranged by three in the Z direction and in two rows in the Y direction.

Each of the two first board accommodating portions 20 is attached to the flat plate 2 in a state where the first board 10 is accommodated in the recess 20a.

As illustrated in FIG. 2, the second board unit 9 includes a second board 40, a second board holding portion 50, a connecting conductive wire 60, and a probe unit 70. The second board unit 9 is attached at a position covering the six openings 20b of the first board unit 8. The second board unit 9 is detachably fixed to the flat plate 2 by a fixing member (not illustrated).

The second board 40 is a rectangular resin circuit board extending in the Y direction and the Z direction. The second board 40 has a probe connection hole 40a penetrating in the thickness direction at the center. The second board 40 has a U-shaped notch 40b extending in the Z direction from one side end extending in the Y direction. In the second board 40, the notch 40b is located at a position corresponding to the position detection opening 54 of the second board holding portion 50 described later.

As illustrated in FIGS. 2 and 4, an electric circuit is formed on the second board 40. The second board 40 has a first board-side terminal portion 41 constituting a terminal on one side of the electric circuit on a surface on the first board 10 side. In addition, the second board 40 has a probe connection terminal portion 42 constituting a terminal on the other side of the electric circuit on a surface on the first board 10 side. The second board 40 has six first board-side terminal portions 41 and six probe connection terminal portions 42 on the surface on the first board 10 side.

The six probe connection terminal portions 42 are located side by side at equal intervals in the circumferential direction around the probe connection hole 40a as viewed from the X direction.

The six first board-side terminal portions 41 are located at positions facing the six second board-side terminal portions 12 of the first board 10, respectively. That is, the six first board-side terminal portions 41 are located on the outer peripheral side of the second board 40 as viewed from the X direction.

The second board holding portion 50 holds the second board 40 in a state where second board 40 is arranged in parallel with the first board 10 in the X direction. Specifically, the second board holding portion 50 includes a body-side holding plate 51 that holds the second board 40 from the first board 10 side and a probe-side holding plate 52 that holds the second board 40 from the probe 71 side. The body-side holding plate 51 is a second holding plate. The probe-side holding plate 52 is a first holding plate.

The second board holding portion 50 has the position detection opening 54 capable of accommodating at least a part of the position detector 6. Details of the position detection opening 54 will be described later.

The body-side holding plate 51 has a plate shape extending in the Y direction and the Z direction. The size of the body-side holding plate 51 in the Y direction and the Z direction is the same as the size of the second board 40 in the Y direction and the Z direction. The body-side holding plate 51 is made of a metal material having high rigidity. The metal material is, for example, a metal having aluminum. The body-side holding plate 51 is located on the first board side of the second board 40.

As illustrated in FIGS. 2 and 4, the body-side holding plate 51 has six rectangular openings 51a penetrating in the thickness direction. The six openings 51a are located at positions corresponding to the first board-side terminal portions 41 in the body-side holding plate 51. That is, the first board-side terminal portion 41 is exposed from the body-side holding plate 51 by the six openings 51a.

As illustrated in FIG. 4, the body-side holding plate 51 has a probe connection hole 51b having a hexagonal shape as viewed from the X direction penetrating in the thickness direction at the center. The probe connection hole 51b is located at a position corresponding to the probe connection terminal portion 42 of the second board 40 in the body-side holding plate 51. That is, the probe connection terminal portion 42 is exposed from the body-side holding plate 51 by the probe connection hole 51b.

The body-side holding plate 51 has a U-shaped notch 54a extending in the Z direction from one side end extending in the Y direction. The notch 54a is a part of the position detection opening 54.

The probe-side holding plate 52 has a plate shape extending in the Y direction and the Z direction. The size of the probe-side holding plate 52 in the Y direction and the Z direction is the same as the size of the body-side holding plate 51 in the Y direction and the Z direction. The thickness of the probe-side holding plate 52 is smaller than the thickness of the body-side holding plate 51. The probe-side holding plate 52 is made of a metal material having high rigidity. The metal material is, for example, a metal having aluminum. The probe-side holding plate 52 is located on the probe 71 side of the second board 40.

As illustrated in FIG. 2, the probe-side holding plate 52 has a probe connection hole 52a penetrating in the thickness direction at the center. The probe connection hole 52a of the probe-side holding plate 52 and the probe connection hole 40a of the second board 40 are located at the same position as viewed from the X direction.

The probe-side holding plate 52 has a U-shaped notch 54b extending in the Z direction from one side end extending in the Y direction. The notch 54b is a part of the position detection opening 54.

The body-side holding plate 51 and the probe-side holding plate 52 are connected to each other by a fixing member (not illustrated) in a state where the second board 40 is sandwiched therebetween. In this manner, by sandwiching the second board 40 from both sides in the thickness direction, deformation of the second board 40 in the thickness direction can be suppressed.

As illustrated in FIG. 2, the connecting conductive wire 60 electrically connects the second board 40 and the probe 71 to be described later. One end portion of the connecting conductive wire 60 is connected to the probe connection terminal portion 42 of the second board 40. The other end of the connecting conductive wire 60 is connected to the probe 71 through the probe connection hole 40a of the second board 40 and the probe connection hole 52a of the probe-side holding plate 52.

The probe unit 70 is attached to the probe-side holding plate 52 on the side opposite to the second board 40 side. The probe unit 70 includes a probe 71 and a probe support 72.

The probe 71 extends in the X direction. The probe 71 detects a signal of an electric circuit of the board W to be inspected by the tip coming into contact with the terminal of the board W to be inspected.

One end of the connecting conductive wire 60 is electrically connected to an end of the probe 71 on the second board 40 side. The other end of the connecting conductive wire 60 is electrically connected to the second board 40. As a result, the signal of the electric circuit of the board W to be inspected detected by the probe 71 is transmitted to the second board 40 via the connecting conductive wire 60.

The probe support 72 supports the probe 71 with respect to the second board holding portion 50. The probe support 72 is fixed to the probe-side holding plate 52 by a fixing member (not illustrated). The fixing member is, for example, a screw, a bolt, or the like. Thus, the probe unit 70 is held by the second board holding portion 50.

As illustrated in FIG. 2, the electrical connection portion 80 is located between the first board 10 and the second board 40. In the present embodiment, the inspection jig 4 has six electrical connection portions 80. The first board 10 side of each electrical connection portion 80 is accommodated in the opening 20b of the first board accommodating portion 20, and is fixed to the first board accommodating portion 20 by a fixing member (not illustrated). The second board 40 side of each electrical connection portion 80 is accommodated in the opening 51a of the body-side holding plate 51.

The electrical connection portion 80 has a first connection portion 81 on the first board 10 side. The first connection portion 81 includes a plurality of contact terminals that are in contact with the second board-side terminal portion 12 of the first board 10. The electrical connection portion 80 has a second connection portion 82 on the second board 40 side. The second connection portion 82 includes a plurality of contact terminals that are in contact with the first board-side terminal portion 41 of the second board 40. At least a part of the first connection portion 81 and the second connection portion 82 can expand and contract in the X direction by the elastic force of the elastic member.

In the present embodiment, the electrical connection portion 80 is constituted by a pogo pin. That is, the first connection portion 81 is pressed against the second board-side terminal portion 12 of the first board 10, and the second connection portion 82 is pressed against the first board-side terminal portion 41 of the second board 40. As a result, the first board 10 and the second board 40 are electrically connected via the electrical connection portion 80.

At this time, since the second board 40 receives the reaction force of the electrical connection portion 80, the second board is easily deformed to the side opposite to the first board 10 side. However, the second board 40 is held by the probe-side holding plate 52 held from the side opposite to the first board 10 side. That is, in the present embodiment, the second board holding portion 50 includes the plate-like probe-side holding plate 52 that holds the second board 40 from the side opposite to the first board 10 side in the thickness direction of the second board 40. As a result, the second board 40 is prevented from being deformed in the thickness direction in a state where the electrical connection portion 80 is in electrical contact with the second board 40.

With the inspection jig 4 having the above configuration, the board W to be inspected can be electrically inspected via the probe 71, the connecting conductive wire 60, the probe connection terminal portion 42 and the first board-side terminal portion 41 of the second board 40, the electrical connection portion 80, and the second board-side terminal portion 12 and the body-side terminal portion 11 of the first board 10. In the second board 40, the interval between the terminals in the first board-side terminal portion 41 can be made wider than the interval between the terminals in the probe connection terminal portion 42. In the first board 10, the interval between the terminals in the body-side terminal portions 11 can be made wider than the interval between the terminals in the second board-side terminal portions 12. As a result, even when the interval between the terminals of the board W to be inspected is very narrow, the inspection jig 4 can set the interval between the terminals of the body-side terminal portions 11 to an interval at which the signal can be detected by the inspection processing portion 3.

Figure 6A:
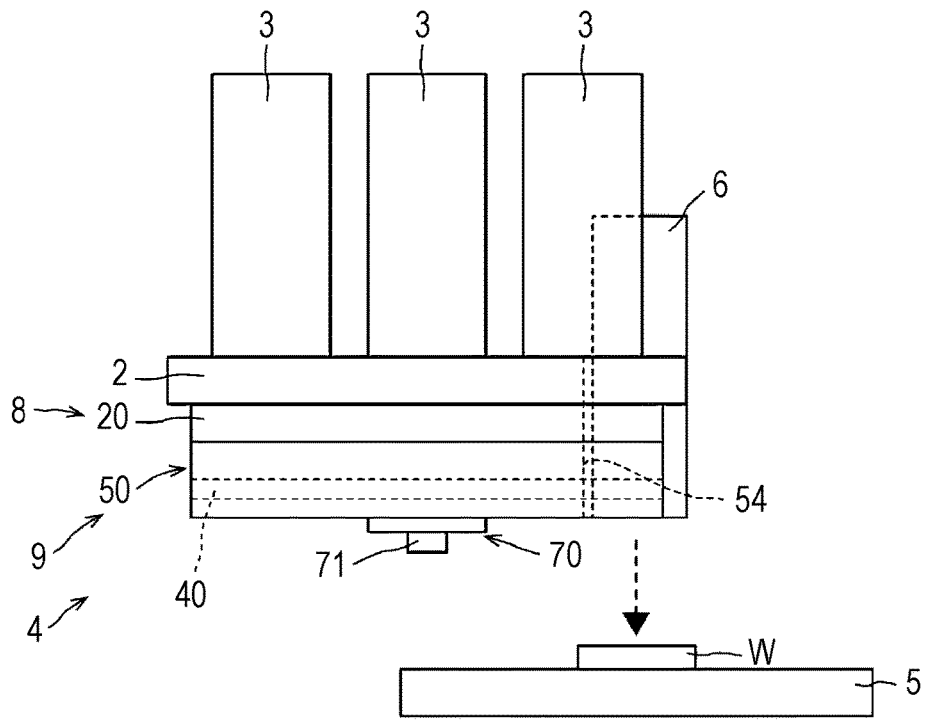
FIG. 6A is a view illustrating a position of a board to be inspected when an inspection position of the board to be inspected is acquired.
Figure 6B:
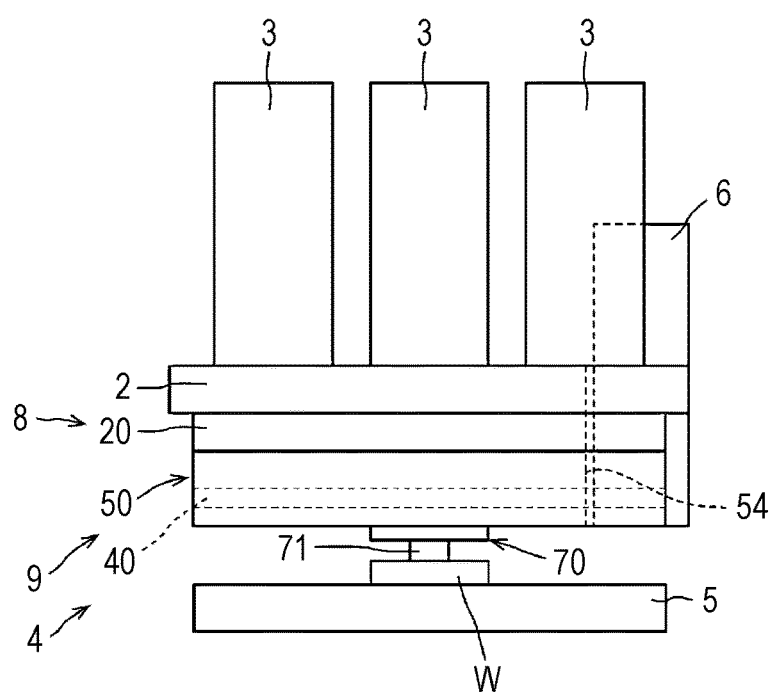
FIG. 6B is a view illustrating a position of a board to be inspected when the board to be inspected is inspected.

Next, the position detection opening 54 will be described in detail with reference to FIGS. 3, 6A, and 6B. FIG. 6A is a view illustrating a position of the board W to be inspected when the inspection position of the board W to be inspected is acquired. FIG. 6B is a view illustrating a position of the board W to be inspected when the board W to be inspected is inspected. As described above, the position detection opening 54 is a notch of the second board holding portion 50. The position detection opening 54 includes the notch 54a of the body-side holding plate 51 and the notch 54b of the probe-side holding plate 52.

As illustrated in FIG. 3, in the present embodiment, the flat plate 2 and the second board 40 also have the notch 2b and the notch 40b at positions corresponding to the position detection opening 54, respectively. The first board unit 8 is attached at a position not covering the notch 2b of the flat plate 2. Thus, the circuit board inspection apparatus 1 includes the position detection opening 54 that extends from one side to the other side in the X direction and is capable of accommodating at least a part of the position detector 6. As a result, the circuit board inspection apparatus 1 can accommodate the position detector 6 at a position closer to the probe unit 70 than the outer periphery. The flat plate 2 and the second board 40 may not have the notch as long as they do not interfere with the position detector 6.

As illustrated in FIG. 6A, the circuit board inspection apparatus 1 positions the board W to be inspected at a position facing the position detector 6 when acquiring the inspection position of the board W to be inspected. As illustrated in FIG. 6B, when the circuit board inspection apparatus 1 inspects the board W to be inspected, the circuit board inspection apparatus 1 positions a terminal of an electric circuit of the board W to be inspected at a position where the terminal comes into contact with the probe 71 of the probe unit 70. That is, the board W to be inspected moves from a position facing the position detector 6 to a position where the board W comes into contact with the tip of the probe 71. Therefore, the shorter the distance between the position detector 6 and the probe unit 70, the shorter the time required for the board W to be inspected to move.

In the circuit board inspection apparatus 1, the second board holding portion 50 that supports the probe unit 70 has the position detection opening 54 that is recessed from the outer periphery thereof toward the probe unit 70 as viewed from the X direction. At least a part of the position detector 6 is accommodated in the position detection opening 54. That is, in the circuit board inspection apparatus 1, the position detection opening 54 allows the position detector 6 to be positioned near the probe 71 without interfering with the second board holding portion 50. Therefore, in the circuit board inspection apparatus 1, the distance between the position detector 6 and the probe 71 can be shortened by the position detection opening 54. As a result, after the position detector 6 confirms the inspection position of the board W to be inspected, the distance by which the probe 71 relatively moves to the inspection position can be shortened. Therefore, the inspection time of the board W to be inspected can be shortened. In addition, since the relative movement distance of the probe 71 becomes short, the movement error becomes small. Therefore, the probe 71 can be accurately positioned at the inspection position.

In the present embodiment, the position detection opening 54 is a notch extending from one side end of the second board holding portion 50 toward the probe unit 70 when the second board 40 is viewed from the X direction. The X direction is a normal direction of a surface on one side of the second board. That is, the position detection opening 54 is a notch extending from the outer periphery of the second board holding portion 50 toward the probe unit 70 when the second board 40 is viewed from the normal direction of one surface thereof.

As a result, when the type of the electric circuit of the board W to be inspected to be inspected is different, the second board 40 can be easily replaced. That is, since the position detector 6 is positioned in the notch of the second board holding portion 50 that holds the second board 40, the second board 40 and the second board holding portion 50 can be replaced without detaching the position detector 6 from the circuit board inspection apparatus 1. Moreover, since the notch extends from the outer periphery of the second board holding portion 50 toward the probe unit 70, the position detector 6 can be positioned at a position closer to the probe 71. Therefore, the movement distance with respect to the inspection jig 4 when inspecting the board W to be inspected can be further shortened. Therefore, the inspection time of the board W to be inspected can be further shortened.

As described above, in order to prevent the second board 40 from being deformed by receiving the reaction force of the electrical connection portion 80, the second board 40 is held by the probe-side holding plate 52 located on the side opposite to the electrical connection portion 80. In the configuration in which the probe-side holding plate 52 has the notch 54b, there is a possibility that the rigidity of the probe-side holding plate 52 for suppressing the deformation of the second board 40 decreases.

However, in the present embodiment, the second board holding portion 50 has the body-side holding plate 51 which is located on the side opposite to the probe-side holding plate 52 with respect to the second board 40 in the thickness direction of the second board 40 and sandwiches the second board 40 together with the probe-side holding plate 52. Accordingly, rigidity of the second board holding portion 50 can be improved. Therefore, even when the second board holding portion 50 has the notch, the rigidity of the second board holding portion 50 can be secured. Therefore, with the above-described configuration, it is possible to provide the inspection jig 4 capable of shortening the inspection time while suppressing the deformation of the second board 40.

The inspection jig 4 according to the present embodiment is the inspection jig 4 attached to the circuit board inspection apparatus 1 including the inspection processing portion 3 that inspects an electric circuit of a circuit board and the position detector 6 used when the inspection processing portion 3 is positioned with respect to the circuit board. The inspection jig 4 includes the probe unit 70 having the probe 71 that comes into contact with the circuit board, the first board 10 on which a signal is detected by the inspection processing portion 3, the second board 40 that is located in parallel with the first board 10 in a thickness direction of the first board 10 and is electrically connected to the probe 71, the electrical connection portion 80 that electrically connects the first board 10 and the second board 40, and the second board holding portion 50 that holds the second board 40 from the first board 10 and holds the probe unit 70 on a side opposite to the first board 10 side, in a state where the electrical connection portion 80 is sandwiched between the first board 10 and the second board 40. The second board holding portion 50 has the position detection opening 54 penetrating the second board holding portion 50 in the thickness direction, at a position overlapping the position detector 6 as viewed from the thickness direction of the second board holding portion 50.

Thus, the position detector 6 can be prevented from interfering with the second board holding portion 50. With the above configuration, after the position detector 6 confirms the inspection position of the circuit board, the distance by which the probe 71 relatively moves to the inspection position can be shortened. Therefore, the inspection time of the circuit board can be shortened.

In addition, the circuit board inspection apparatus 1 according to the present embodiment includes the position detector 6 used for positioning the inspection processing portion 3 with respect to the board W to be inspected, and the inspection jig 4.

Accordingly, it is possible to provide the circuit board inspection apparatus 1 capable of shortening the inspection time.

While an embodiment of the present disclosure has been described above, the above embodiment is merely an example. Accordingly, the present disclosure is not limited to the embodiment described above, and the embodiment described above may be appropriately modified and implemented without departing from the scope of the present disclosure.

Figure 7:
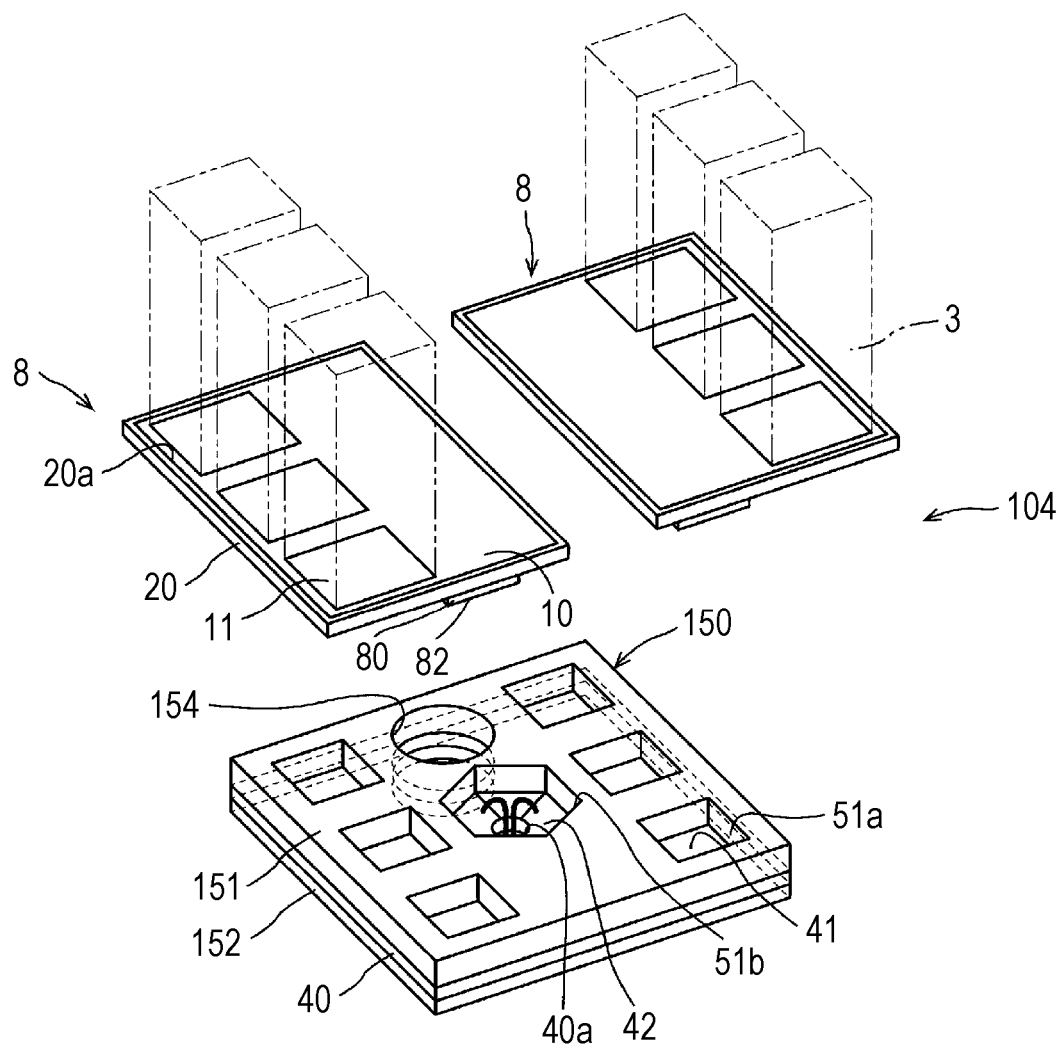
FIG. 7 is an exploded perspective view of an inspection jig according to another embodiment.

In the above embodiment, the position detection opening 54 of the inspection jig 4 is a notch extending inward from the outer periphery of the second board holding portion 50 as viewed in the thickness direction. However, as illustrated in FIG. 7, a position detection opening 154 of an inspection jig 104 may be a through hole penetrating a body-side holding plate 151 and a probe-side holding plate 152 of a second board holding portion 150 in the thickness direction thereof. As a result, the position detection opening 154 can accommodate at least a part of the position detector 6 in the through hole.

In the above embodiment, the position detection opening 54 is a U-shaped notch as viewed from the X direction. However, the position detection opening may have any shape as long as it can accommodate at least a part of the position detector and the notch extends toward the probe unit.

Figure 8:
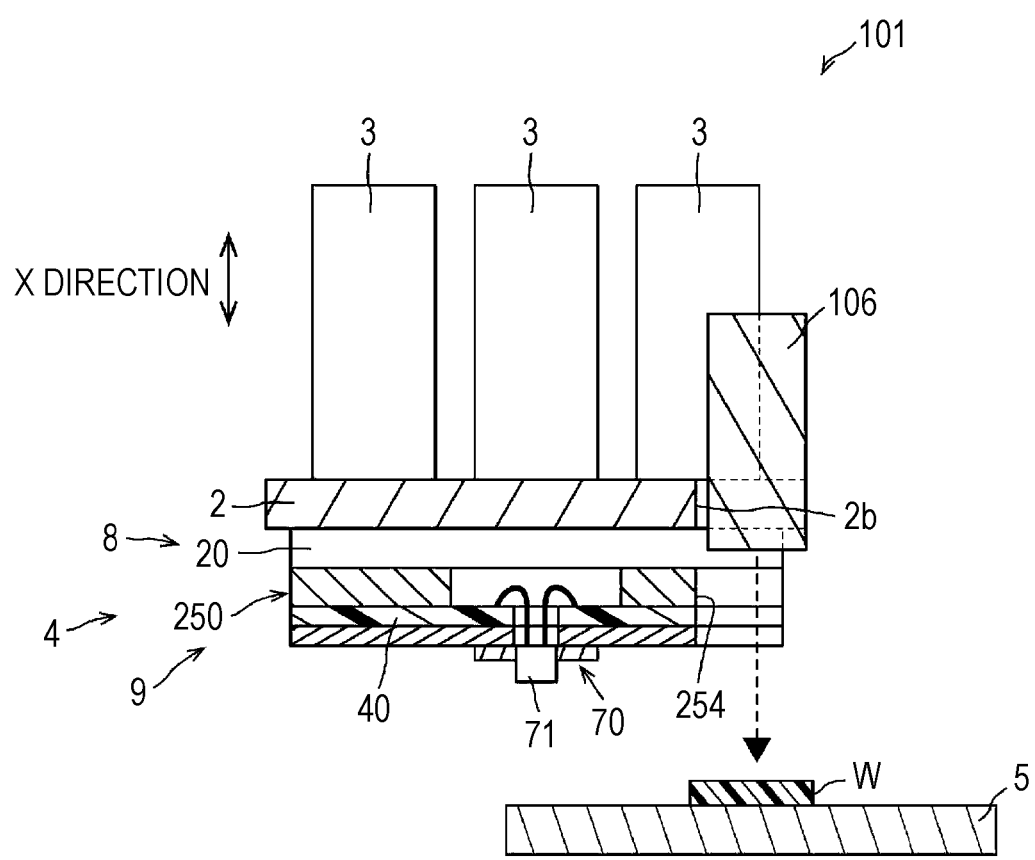
FIG. 8 is a cross-sectional view illustrating a schematic configuration of a circuit board inspection apparatus according to another embodiment.

In the above embodiment, the second board holding portions 50 and 150 of the circuit board inspection apparatus 1 have the position detection openings 54 and 154 that accommodate at least a part of the position detector 6. However, a second board holding portion 250 of a circuit board inspection apparatus 101 may have a position detection opening 254 that penetrates the second board holding portion 250 in the thickness direction but does not accommodate the position detector. For example, as illustrated in FIG. 8, in the circuit board inspection apparatus 101, a position detector 206 is located on the side opposite to the side of the board W to be inspected, with the position detection opening 254 interposed therebetween, with respect to the second board holding portion 250. The position detector 206 can acquire the inspection position of the board W to be inspected by the position detection opening 254 without interfering with the second board holding portion 250. Accordingly, it is possible to provide the circuit board inspection apparatus 1 capable of shortening the inspection time. Further, the position detection opening 154 may be a notch or a through hole.

In the above embodiment, the case where the circuit board inspection apparatus 1 includes six inspection processing portions 3 has been described as an example. Therefore, the flat plate 2 has six openings 2a, the two first board accommodating portions 20 together have six openings 20b, and the body-side holding plate 51 has six openings 51a. However, as long as electrical connection corresponding to the number of inspection processing portions can be configured, the number of openings of each member may be any number.

In the above embodiment, the case where the circuit board inspection apparatus 1 includes six inspection processing portions 3 has been described as an example. Therefore, the two first boards 10 together have six body-side terminal portions 11 and six second board-side terminal portions 12, and the second board 40 has six first board-side terminal portions 41 and six probe connection terminal portions 42. The circuit board inspection apparatus 1 has six electrical connection portions 80. However, as long as electrical connection can be made according to the number of inspection processing portions, the number of terminal portions of each member may be any number. In addition, the number of electrical connection portions may be any number.

In the above embodiment, the circuit board inspection apparatus 1 includes two first board units 8. However, the number of first board units may be other than two.

In the above embodiment, the two first board units 8 are located at positions not interfering with the position detection opening 54. Therefore, the first board unit 8 does not have a notch that accommodates the position detection opening 54. However, the first board unit may be located at a position interfering with the position detection opening. In this case, the first board unit only needs to have a notch at a position corresponding to the position detection opening.

In the above embodiment, the electrical connection portion 80 is attached to the first board unit 8. However, the electrical connection portion may be sandwiched and held between the second board and the first board.

In the above embodiment, the electrical connection portion 80 includes the first connection portion 81 and the second connection portion 82 at least a part of which is stretchable in the X direction by the elastic force of the elastic member. However, the electrical connection portion may have a first connection portion and a second connection portion that do not expand and contract in the X direction.

In the above embodiment, the second board holding portion 50 that holds the second board 40 includes the body-side holding plate 51 and the probe-side holding plate 52. However, the second board holding portion may include either one of the body-side holding plate and the probe-side holding plate.

In the above embodiment, the openings 2a, 10a, and 51a have rectangular shapes as viewed from the X direction. However, the opening may have any shape as long as the shape does not hinder electrical connection between the terminal portion of the member accommodated in the opening and the terminal portion of the member exposed by the opening.

In the above embodiment, the probe connection hole 51b has a hexagonal shape as viewed from the X direction. However, the probe connection hole may have other shapes.

The present disclosure is applicable to a circuit board inspection apparatus that positions an inspection target on an inspection jig after confirming the inspection target with a camera.

Features of the above-described embodiments and the modifications thereof may be combined appropriately as long as no conflict arises.

While certain embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig that is attached to a circuit board inspection apparatus, the circuit board inspection apparatus including:
   an inspection processing portion configured to inspect an electric circuit of a circuit board; and
   a position detector used for positioning the inspection processing portion with respect to the circuit board,
   the inspection jig comprising:
   a probe unit including a probe that comes into contact with the circuit board;
   a first board on which a signal is detected by the inspection processing portion;
   a second board located in parallel with the first board in a thickness direction of the first board and electrically connected to the probe;
   an electrical connection portion configured to electrically connect the first board and the second board; and
   a second board holding portion configured to hold the second board from the first board and holds the probe unit on a side opposite to the first board side, in a state where the electrical connection portion is sandwiched between the first board and the second board,
   wherein the second board holding portion has a position detection opening penetrating the second board holding portion in the thickness direction, the position detection opening being located at a position overlapping the position detector as viewed from the thickness direction of the second board holding portion.

2. The inspection jig according to claim 1, wherein the position detection opening is capable of accommodating at least a part of the position detector.

3. The inspection jig according to claim 1, wherein the position detection opening is a notch extending from an outer periphery of the second board holding portion toward the probe unit when the second board is viewed from a normal direction of one surface of the second board.

4. The inspection jig according to claim 1, wherein the position detection opening is a through hole.

5. The inspection jig according to claim 1, wherein the second board holding portion includes a plate-shaped first holding plate that holds the second board from a side opposite to the first board side in a thickness direction of the second board.

6. The inspection jig according to claim 5, wherein the second board holding portion includes a second holding plate that is located on a side opposite to the first holding plate with respect to the second board in the thickness direction of the second board and sandwiches the second board together with the first holding plate.

7. A circuit board inspection apparatus comprising:
an inspection processing portion configured to inspect an electric circuit of a circuit board;
a position detector used when the inspection processing portion is positioned with respect to the circuit board; and
the inspection jig according to claim 1.

8. The circuit board inspection apparatus according to claim 7, wherein
at least a part of the position detector is accommodated in the position detection opening.

9. The circuit board inspection apparatus according to claim 7, wherein
the position detector is located on a side opposite to the circuit board side, with the position detection opening interposed therebetween, with respect to the second board holding portion.

10. The inspection jig according to claim 2, wherein the position detection opening is a notch extending from an outer periphery of the second board holding portion toward the probe unit when the second board is viewed from a normal direction of one surface of the second board.

11. The inspection jig according to claim 2, wherein the position detection opening is a through hole.

12. The inspection jig according to claim 2, wherein the second board holding portion includes a plate-shaped first holding plate that holds the second board from a side opposite to the first board side in a thickness direction of the second board.

13. The inspection jig according to claim 3, wherein the second board holding portion includes a plate-shaped first holding plate that holds the second board from a side opposite to the first board side in a thickness direction of the second board.

14. The inspection jig according to claim 4, wherein the second board holding portion includes a plate-shaped first holding plate that holds the second board from a side opposite to the first board side in a thickness direction of the second board.

15. A circuit board inspection apparatus comprising:
an inspection processing portion configured to inspect an electric circuit of a circuit board;
a position detector used when the inspection processing portion is positioned with respect to the circuit board; and
the inspection jig according to claim 2.

16. A circuit board inspection apparatus comprising:
an inspection processing portion configured to inspect an electric circuit of a circuit board;
a position detector used when the inspection processing portion is positioned with respect to the circuit board; and
the inspection jig according to claim 3.

17. A circuit board inspection apparatus comprising:
an inspection processing portion configured to inspect an electric circuit of a circuit board;
a position detector used when the inspection processing portion is positioned with respect to the circuit board; and
the inspection jig according to claim 4.

18. A circuit board inspection apparatus comprising:
an inspection processing portion configured to inspect an electric circuit of a circuit board;
a position detector used when the inspection processing portion is positioned with respect to the circuit board; and
the inspection jig according to claim 5.

19. A circuit board inspection apparatus comprising:
an inspection processing portion configured to inspect an electric circuit of a circuit board;
a position detector used when the inspection processing portion is positioned with respect to the circuit board; and
the inspection jig according to claim 6.

* * * * *